United States Patent
Kobayashi et al.

(10) Patent No.: US 6,809,015 B2
(45) Date of Patent: Oct. 26, 2004

(54) METHOD FOR HEAT TREATMENT OF SILICON WAFERS AND SILICON WAFER

(75) Inventors: Norihiro Kobayashi, Annaka (JP); Shoji Akiyama, Annaka (JP); Yuuichi Matsumoto, Annaka (JP); Masaro Tamatsuka, Annaka (JP)

(73) Assignee: Shin-Etsu Handotai Co., Ltd., Tokyo (JP)

( * ) Notice: Subject to any disclaimer, the term of this patent is extended or adjusted under 35 U.S.C. 154(b) by 22 days.

(21) Appl. No.: 10/338,726

(22) Filed: Jan. 9, 2003

(65) Prior Publication Data

US 2003/0104709 A1 Jun. 5, 2003

Related U.S. Application Data

(62) Division of application No. 09/622,203, filed on Aug. 14, 2000, now Pat. No. 6,573,159.

(30) Foreign Application Priority Data

Dec. 28, 1998 (JP) ............................................ 10-372797
Jan. 22, 1999 (JP) .............................................. 11-14400

(51) Int. Cl.[7] .............................................. H01L 21/24
(52) U.S. Cl. ...................... 438/540; 438/624; 438/913; 438/935; 438/955; 438/974
(58) Field of Search ................................. 438/471, 540, 438/624, 913, 935, 955, 974, FOR 144, FOR 298, FOR 407

(56) References Cited

U.S. PATENT DOCUMENTS

| 4,378,269 A | 3/1983 | Matsushita et al. |
| 5,968,264 A | 10/1999 | Iida et al. |
| 6,136,684 A | 10/2000 | Sato et al. |
| 6,191,009 B1 | 2/2001 | Tamatsuka et al. |
| 6,217,650 B1 | 4/2001 | Hirose et al. |
| 6,245,311 B1 | 6/2001 | Koboayashi et al. |
| 6,254,672 B1 | 7/2001 | Falster et al. |

FOREIGN PATENT DOCUMENTS

| JP | 60-247935 | 12/1985 |
| JP | 61-193458 | 8/1986 |
| JP | 62-123098 | 6/1987 |
| JP | A-2-248051 | 10/1990 |
| JP | A-4-167433 | 6/1992 |

(List continued on next page.)

OTHER PUBLICATIONS

S. Yamakawa et al., "Study of interface roughness dependence of electron mobility in Si inversion layers using the Monte Carlo method," *American Institute of Physics*, Jan. 1996, vol. 79, pp. 911–916.

*Primary Examiner*—George Fourson
*Assistant Examiner*—Joannie Adelle Garcia
(74) *Attorney, Agent, or Firm*—Oliff & Berridge, PLC

(57) ABSTRACT

According to the present invention, there are provided a method for heat treatment of silicon wafers wherein a silicon wafer is subjected to a heat treatment at a temperature of from 1000° C. to the melting point of silicon in an inert gas atmosphere, and temperature decreasing in the heat treatment is performed in an atmosphere containing 1–60% by volume of hydrogen, a method for heat treatment of silicon wafers under a reducing atmosphere containing hydrogen by using a rapid heating and rapid cooling apparatus, wherein temperature decreasing rate from the maximum temperature in the heat treatment to 700° C. is controlled to be 20° C./sec or less, and a silicon wafer which has a crystal defect density of $1.0 \times 10^4$ defects/cm$^3$ or more in a wafer bulk portion, a crystal defect density of $1.0 \times 10^4$ defects/cm$^3$ or less in a wafer surface layer of a depth of 0.5 μm from the surface, a crystal defect density of 0.15 defects/cm$^2$ or less on a wafer surface and surface roughness of 1.0 nm or less in terms of the P-V value. By these, crystal defects in wafer surface layers can be reduced by a simple method with a small amount of hydrogen used without degrading microroughness of wafers.

1 Claim, 5 Drawing Sheets

FOREIGN PATENT DOCUMENTS

| | | |
|---|---|---|
| JP | A-5-144827 | 6/1993 |
| JP | A-5-218053 | 8/1993 |
| JP | A-5-308076 | 11/1993 |
| JP | A-6-196459 | 7/1994 |
| JP | A-6/252154 | 9/1994 |
| JP | 06-295912 | 10/1994 |
| JP | 6-349839 | 12/1994 |
| JP | 07-161707 A | 6/1995 |
| JP | A-7-235507 | 9/1995 |
| JP | A-7-235534 | 9/1995 |
| JP | A-7-321120 | 12/1995 |
| JP | 08-162461 | 6/1996 |
| JP | 08-264549 | 10/1996 |
| JP | 08-264552 | 10/1996 |
| JP | A-10-79364 | 3/1998 |
| JP | A-10-326790 | 12/1998 |
| JP | 11-354529 | 12/1999 |

METHOD FOR HEAT TREATMENT OF SILICON WAFERS AND SILICON WAFER

This is a Division of application Ser. No. 09/622,203 filed Aug. 14, 2000 now U.S. Pat No. 6,513,159. The entire disclosure of the prior application(s) is hereby incorporated by reference herein in its entirety.

TECHNICAL FIELD

The present invention relates to a method for heat treatment of silicon wafers, in particular, a method for heat treatment of silicon wafers that shows superior safety and can give silicon wafers of high quality.

BACKGROUND ART

As wafers for manufacturing semiconductor devices such as semiconductor integrated circuits, silicon wafers are mainly used. In such production of semiconductor devices, crystal defects which exist in wafer surface layers such as COPs (Crystal Originated Particles) can be mentioned as one of factors that degrade the yield. If such crystal defects exist in wafer surface layers, they may be a cause of degradation of electric characteristics of wafers. For example, in transistors of MOS structure, when high voltage is applied to a thermal oxide film formed on a wafer surface such as a gate oxide film, they may cause generation of dielectric breakdown of the oxide film.

As a further factor that worsens the yield of semiconductor device production, microroughness on wafer surfaces can be mentioned. It is known that microroughness that exists on wafer surfaces adversely affect carrier mobility directly under the gate oxide films (see Shinya Yamakawa, Hirai Ueno, Kenji Taniguchi, Chihiro Hamaguchi, Kazuo Miyatsuji, Umbert Ravaioli, J. Appl. Phys., 79, 911, 1995). In semiconductor devices, if degree of integration is increased, carrier mobility must correspondingly be increased. Moreover, with recent use of increasingly higher driving frequency of CPU, write time and read time of memories are required to be made higher. Therefore, it has come to be considered more important to make microroughness small in order to improve carrier mobility.

As a method for reducing crystal defects of silicon wafer surface layers, elimination of the defects by annealing heat treatment and so forth have been performed. A typical example thereof is high temperature hydrogen annealing. This method is a method for eliminating crystal defects by performing annealing heat treatment in a hydrogen atmosphere at a high temperature (see Japanese Patent Laid-open Publication (Kokai) No. 6-349839).

However, although a heat treatment in a hydrogen atmosphere can reduce crystal defects in wafer surface layers, it has a drawback that surfaces of wafers will be etched by the heat treatment. For example, when a heat treatment is performed at 1200° C. for 60 minutes, about 0.5 μm of silicon of wafer surface layers will be etched. For this reason, thickness of the portions of wafer surfaces with few crystal defects (defect-free layer) becomes small.

Furthermore, it is very dangerous to handle hydrogen gas at a high concentration at such a high temperature over a long period of time. Thus, it cannot be practically used without solving the problem of safety.

Therefore, there has also been proposed a method for eliminating crystal defects of wafer surface layers by performing a heat treatment using an inert gas such as argon for the atmosphere. However, although the crystal defects in wafer surface layers can be reduced by this method without etching wafer surface layers, it has a drawback that it worsens microroughness on wafer surfaces compared with that before the heat treatment.

In addition, there is also an abuse that local etching comes to be likely to occur due to the influence of a small amount of oxygen in the atmosphere, and thus haze is generated.

The term "haze" used herein is an index of surface roughness, and means periodical waviness having a period of several to several tens of nanometers on the wafer surfaces. It is surface roughness that can be semi-quantitatively evaluated as a haze level of a whole wafer surface by scanning the whole wafer surface with a particle counter mainly utilizing a laser, and measuring strength of scattered reflection thereof.

Another method for avoiding the danger of hydrogen gas, there has also been contemplated a method utilizing a heat treatment with a hydrogen atmosphere and a heat treatment with an inert gas atmosphere such as argon in combination. This method comprises first performing a heat treatment of wafers in an inert gas atmosphere, and then performing a heat treatment of the wafers in a hydrogen atmosphere (see Japanese Patent Laid-open Publication No. 4-167433).

However, the heat treatment in an atmosphere containing hydrogen at the same temperature as the preceding heat treatment in an inert gas atmosphere will eventually etch wafer surfaces, and thus the defect-free layer thickness will become small.

Further, Japanese Patent Laid-open Publication No. 7-235507 discloses a method which comprises performing a heat treatment in an inert atmosphere, wherein hydrogen is introduced into the atmosphere during the temperature increasing or temperature decreasing period of the heat treatment. However, this method was accomplished with the purpose of preventing generation of slip dislocations in wafers by introducing hydrogen having heat conductivity higher than that of inert gas during the temperature increasing or temperature decreasing, and this method is not for eliminating crystal defects which exist in wafer surface layers or improving microroughness on wafer surfaces.

That is, this method simply comprises continuously introducing 1 liter/minute of hydrogen during the temperature increasing and decreasing, and an optimum composition of the heat treatment atmosphere during the temperature increasing and decreasing is unknown. Therefore, even if this method is used, the etching amount of the wafer surfaces may become large, or microroughness may be worsened. Thus, crystal defect density and surface roughness cannot be improved simultaneously.

As described above, among the conventional heat treatment methods, there are no method for reducing crystal defects of wafer surface layers without etching wafer surface layers and without degrading microroughness of wafers, with a little amount of hydrogen used. Therefore, it is desired to develop an effective method.

Furthermore, in the hydrogen annealing, the heat treatment is usually performed under a hydrogen gas atmosphere by increasing temperature at a temperature increasing rate of 1–10° C./min, maintaining a temperature of from 950° C. to the melting point of silicon for several hours, and then decreasing the temperature at a temperature decreasing rate of 2–5° C./min (for example, Japanese Patent Publication (Kokoku) No. 5-18254 and Japanese Patent Laid-open Publication No. 6-295912). However, this heat treatment method has a drawback that the heat treatment requires a long period of time.

Therefore, it has been proposed a method for heat treatment using an apparatus for rapid heating and rapid cooling (Rapid Thermal Annealer, also abbreviated as "RTA apparatus" hereinafter) in order to shorten the heat treatment time etc. For example, in Japanese Patent Application No. 10-82606, the inventors of the present invention previously proposed a method for heat treatment of silicon wafers under a reducing atmosphere using an RTA apparatus, and proposed a method for heat treatment that can, in particular, reduce the COP density on surfaces of silicon wafers.

This method comprises a heat treatment of silicon wafers within a temperature range of from 1200° C. to the melting point of silicon for 1–60 seconds under a reducing atmosphere. In this method, it is further preferred that 100% hydrogen or a mixed atmosphere of hydrogen and argon is used as the reducing atmosphere, and the heat treatment time is selected to be 1–30 seconds.

Further, it was found that COP density on surfaces of silicon wafers was markedly reduced and one of the electric characteristics, oxide dielectric breakdown voltage (Time Zero Dielectric Breakdown: TDDB), was also markedly improved by this method.

However, this method has a drawback that the aforementioned surface roughness on wafer surfaces after the heat treatment, called haze, may be degraded.

In addition, as mentioned above, it is known that surface roughness on wafer surfaces such as haze closely relates to performance and reliability of devices as a factor which greatly affects the electrical characteristics such as oxide dielectric breakdown voltage and carrier mobility (see Shinya Yamakawa et. al., J. Appl. Phys. 79, 911, 1996), and haze on wafer surfaces is considered a big problem.

Therefore, in Japanese Patent Application No. 10-176693, the inventors of the present invention proposed a method wherein the RTA heat treatment is performed with two or more divided steps as a method for solving that problem. In this method, a heat treatment of a preceding step is performed with the purpose of reduction of COPs, and a heat treatment of a subsequent step is performed in order to improve surface roughness on wafer surfaces such as haze.

Since this method can sufficiently improve haze while reducing COPs, it is a very useful method. However, because it requires performing two or more steps of high temperature heat treatments in an RTA apparatus, it has a drawback of complicated process steps. Such complicated process steps lead to increase of cost due to decrease of throughput. Therefore, it is desired to be further improved.

DISCLOSURE OF THE INVENTION

The present invention was accomplished in view of such problems as mentioned above, and an object of the present invention is to provide a method for heat treatment that can reduce crystal defects in wafer surface layers without etching wafer surface layers and without degrading microroughness on wafer surfaces with a small amount of hydrogen used.

Another object of the present invention is to provide a method for heat treatment of silicon wafers using a rapid heating and rapid cooling apparatus, which can reduce COPs and haze of wafer surfaces in a simpler manner.

In order to achieve the aforementioned objects, the present invention provides a method for heat treatment of silicon wafers, wherein a silicon wafer is subjected to a heat treatment at a temperature of from 1000° C. to the melting point of silicon in an inert gas atmosphere, and temperature decreasing in the heat treatment is performed in an atmosphere containing 1–60% by volume of hydrogen.

Thus, by subjecting a silicon wafer to a heat treatment at temperature of from 1000° C. to the melting point of silicon in an inert gas atmosphere, crystal defects of the wafer surface layer can be eliminated first. Then, by decreasing the temperature in an atmosphere containing 1–60% by volume of hydrogen during temperature decrease of the heat treatment, microroughness can be improved thanks to migration of silicon atoms on the wafer surface. In this method, since the amount of hydrogen gas used may be small, the safety of the heat treatment step can also be improved.

In the above method, the aforementioned inert gas atmosphere preferably consists of an argon atmosphere or an argon atmosphere containing 30% by volume or less of hydrogen.

This is because argon is easily handled, and even when it contains hydrogen, etching due to hydrogen contained in the atmosphere hardly occurs if its concentration is 30% by volume or less, and the effect of improving microroughness on the wafer surfaces will become higher to the contrary.

The present invention also provides a method for heat treatment of silicon wafers under a reducing atmosphere containing hydrogen by using a rapid heating and rapid cooling apparatus, wherein temperature decreasing rate from the maximum temperature in the heat treatment to 700° C. is controlled to be 20° C./sec or less.

By employing such a simple method as described above, i.e., only by using a temperature decreasing rate of 20° C./sec or less from the maximum temperature in the heat treatment to 700° C., in a method for heat treatment of silicon wafers using a rapid heating and rapid cooling apparatus, haze can be improved while COPs of the wafer surface are simultaneously reduced.

In the above method, it is preferred that the temperature decreasing rate in a region below 700° C. in the heat treatment should be faster than the temperature decreasing rate from the maximum temperature to 700° C.

By using a temperature decreasing rate in a region below 700° C. in the heat treatment faster than the temperature decreasing rate in a region of from the maximum temperature to 700° C. as described above, the whole heat treatment time can be shortened, and thus the efficiency of the heat treatment can further be improved.

In the above method, it is preferred that the aforementioned reducing atmosphere containing hydrogen should be 100% hydrogen or a mixed gas atmosphere of hydrogen with argon and/or nitrogen.

Such a heat treatment atmosphere can surely reduce COP density on the wafer surface and improve haze.

Moreover, in a silicon wafer subjected to the heat treatment by the aforementioned method of the present invention, COP density on the wafer surface is decreased and haze is made small by the simple method, and thus the electric characteristics of the silicon wafer such as oxide dielectric breakdown voltage and carrier mobility can be improved. Therefore, extremely useful silicon wafers of extremely high quality can be obtained with high productivity.

Specifically, for example, the silicon wafer can be a silicon wafer having a crystal defect density of $1.0 \times 10^4$ defects/cm$^3$ or more in the wafer bulk portion, a crystal defect density of $1.0 \times 10^4$ defects/cm$^3$ or less in the wafer surface layer of a depth of 0.5 μm from the surface, a crystal defect density of 0.15 defects/cm$^2$ or less on the wafer surface and surface roughness of 1.0 nm or less in terms of the P-V value.

The term "wafer bulk portion" used herein means a portion of wafer present at a depth exceeding 0.5 μm from the wafer surface.

Thus, the silicon wafer of present invention can be a silicon wafer with a low crystal defect density of $1.0 \times 10^4$ defects/cm$^3$ or less in the wafer surface layer of a depth of 0.5 μm from the surface and less surface roughness of 1.0 nm or less in terms of the P-V value, even though it had a high crystal defect density during the growth of a silicon single crystal. In addition, since it contains crystal defects required for gettering of impurities such as heavy metals in the bulk portion, semiconductor devices showing superior oxide dielectric breakdown voltage characteristics and carrier mobility can be produced and the yield of the device production can be improved, if the devices are produced by using the silicon wafer of the present invention.

As explained above, according to the present invention, there can be obtained a silicon wafer having few crystal defects on the wafer surface, a large thickness of the defect-free wafer surface layer and less microroughness on the wafer surface by using a specifically defined optimum composition of the heat treatment atmosphere in a method of heat treatment of silicon wafers. Therefore, the yield of the device production can be improved. In addition, since it becomes possible to minimize the amount of hydrogen used by the method of the present invention, the safety of the heat treatment operation can be secured.

In addition, according to the present invention, a heat treatment having both effects for eliminating defects such as COPs on wafer surfaces and improving haze can be performed in an extremely simple manner by using an improved temperature decreasing rate of the heat treatment in a method for heat treatment of silicon wafers using a rapid heating and rapid cooling apparatus. Thus, it becomes possible to obtain silicon wafers of higher quality compared with conventional ones with lower cost in a simple manner.

BEST MODE FOR CARRYING OUT THE INVENTION

Hereafter, the present invention will be explained in more detail.

The present invention was accomplished as a result of the present inventors' various quantitative researches about heat treatment conditions of silicon wafers, in particular, about compositions of heat treatment atmosphere, in which they found the optimum conditions.

The inventors of the present invention performed first experiments and investigation about influence of atmospheric conditions during temperature increasing and temperature decreasing in the heat treatment on the surface conditions of wafers. First, heat treatment experiments were performed, in which a plurality of silicon wafers of the same specification were prepared, inserted into a heat treatment furnace, heated to 1200° C. at a temperature increasing rate of 10° C./min, maintained at 1200° C. for 60 minutes, and then cooled at a temperature decreasing rate of 3° C./min. During the temperature increasing and temperature decreasing, the atmosphere was changed for each wafer to perform the heat treatments, and microroughness of the wafers after the heat treatments was evaluated by measuring P-V values (maximum difference between peaks and valleys). The measurement was performed for 2 μm squares by using AFM (atomic force microscope). The results of the measurement are shown in FIG. 1.

Figure 1:
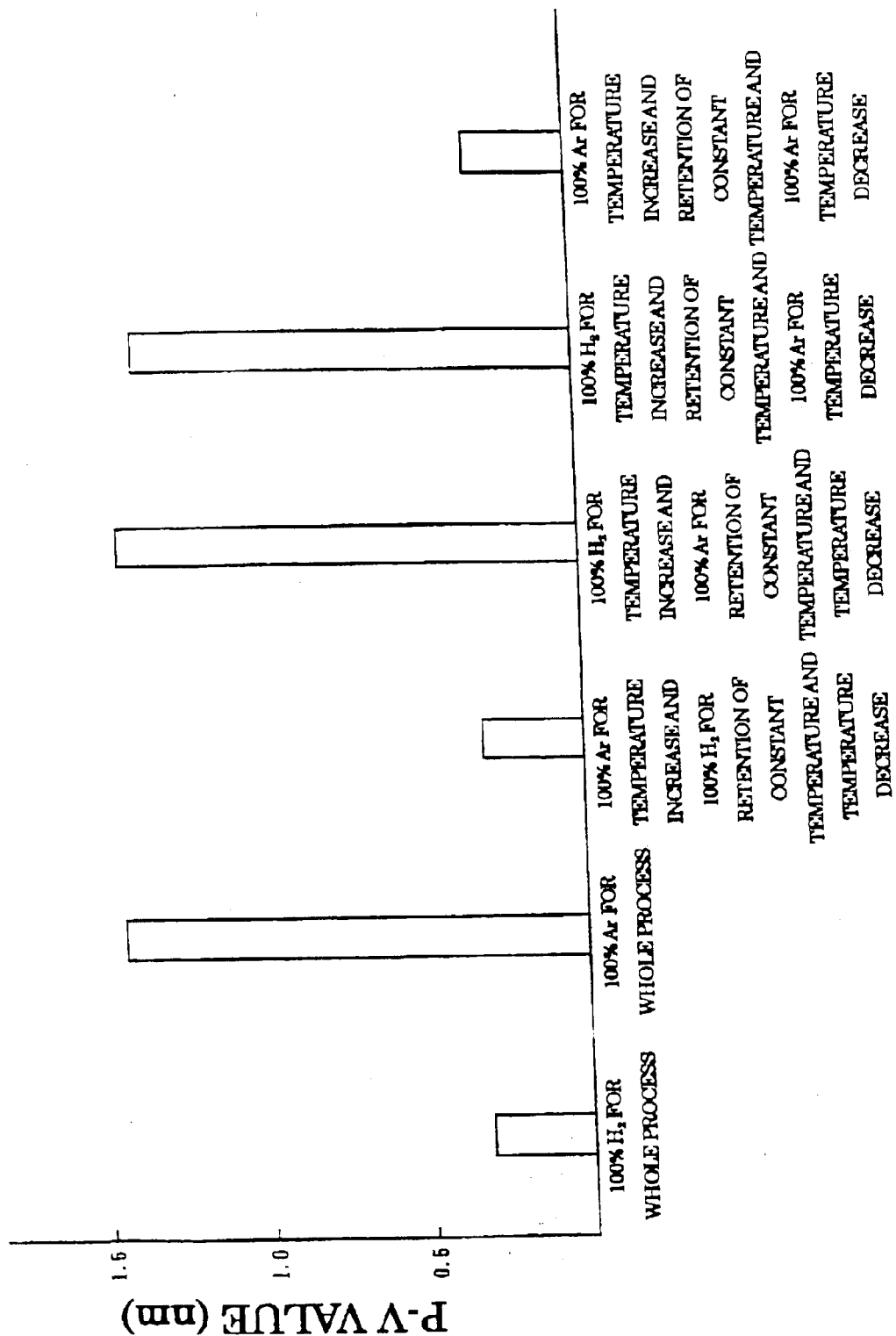
FIG. 1 is a graph representing the relationship between atmospheric conditions during temperature increasing and temperature decreasing in heat treatment and P-V values of wafers after the heat treatment.

From the results of FIG. 1, it can be seen that the P-V value obtained for the case where the heat treatment was performed under the atmosphere consisting only of argon as conventionally known was degraded by about 4 times compared with the value for the case where the heat treatment was performed under the atmosphere consisting only of hydrogen. Moreover, it can also be seen that this tendency was not affected at all when each atmosphere during the temperature increasing was changed to the other gas.

On the other hand, the results differed when the atmosphere during the temperature decreasing was changed and it could be seen as follows. That is, when the atmosphere during the temperature decreasing was changed from the hydrogen atmosphere to the argon atmosphere, the P-V value was degraded in spite of the fact that the heat treatment was performed in the hydrogen atmosphere. In contrast, when the atmosphere during the temperature decreasing was changed from the argon atmosphere to the hydrogen atmosphere, there was obtained a P-V value comparable to that obtained by the heat treatment under the hydrogen atmosphere although the heat treatment was performed under the argon atmosphere.

From these results, it was found that microroughness of wafers was not affected by the atmosphere during the temperature increasing at all, but the atmospheric conditions during the temperature decreasing determined microroughness of wafers. That is, even though the heat treatment is performed in the argon atmosphere, wafer surfaces comparable to those obtained from the heat treatment under the hydrogen atmosphere can be obtained by changing the atmosphere into the hydrogen atmosphere during the temperature decreasing.

However, if the hydrogen concentration in the atmosphere during the temperature decreasing is made too high, etching amounts of wafers are increased and it is not preferred. Therefore, the inventors of the present invention further performed experiments and examination about atmospheric conditions of the heat treatment. Experiments were performed in the same manner as in the aforementioned experiments, in which a plurality of silicon wafers of the same specification were prepared, heated at a temperature increasing rate of 10° C./min, maintained at 1200° C. for 60 minutes, and then cooled at a temperature decreasing rate of 3° C./min. The heat treatments were performed with introducing hydrogen into the argon atmosphere during the temperature decreasing at each of different volume ratios varying in the range of 1–100% by volume for each wafer. Microroughness of the wafers subjected to the heat treatment was evaluated by measuring P-V values of the wafers. The results are shown in FIG. 2.

Figure 2:
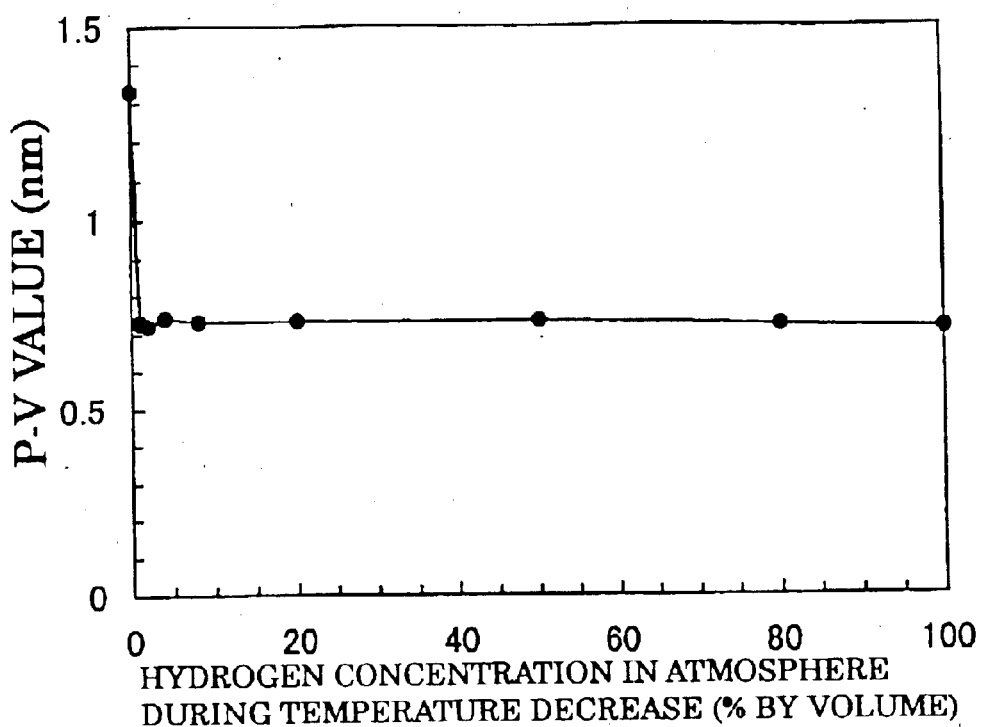
FIG. 2 is a graph representing the relationship between hydrogen concentrations during temperature decreasing in heat treatment and P-V values of wafers after the heat treatment.

From the results of FIG. 2, the effect of improving surface roughness of wafers can be obtained if the amount of mixed hydrogen during the temperature decreasing is 1% by volume or more. From this, it is concluded that microroughness of wafers can be improved with the minimum amount of hydrogen used by performing the heat treatment in an inert atmosphere such as argon, and by introducing 1% by volume or more of hydrogen during the temperature decreasing.

Conversely, it was found that, if the amount of mixed hydrogen is 1% by volume or less, the effect of improving surface roughness of wafers is markedly reduced, and hence it is important that the amount of mixed hydrogen should be 1% by volume or more.

Figure 3:
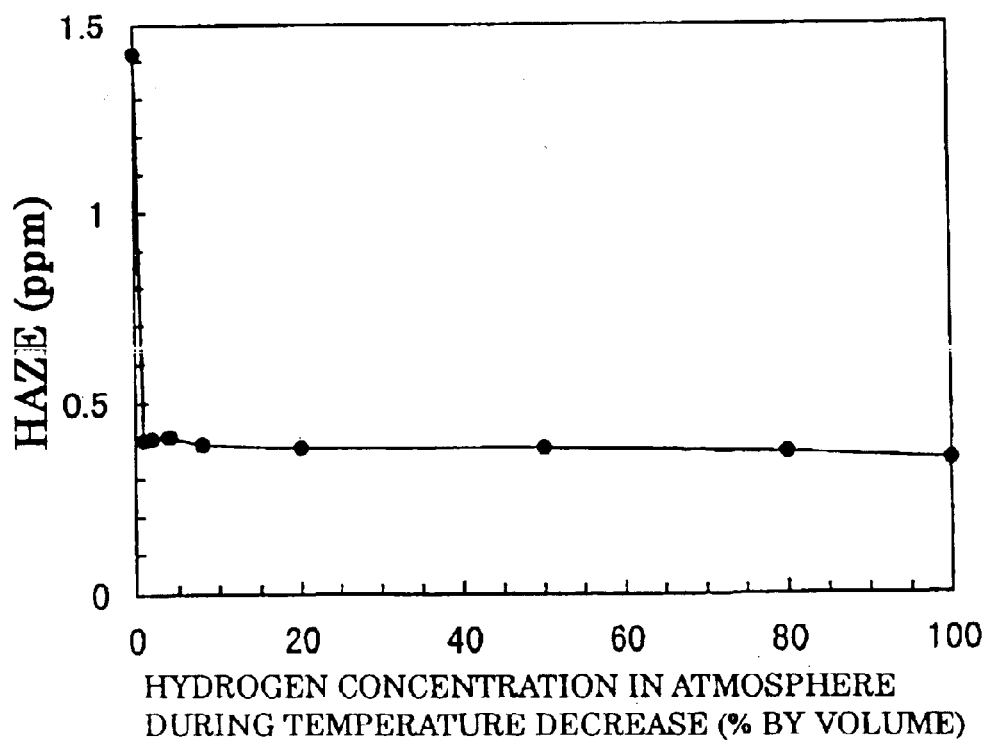
FIG. 3 is a graph representing the relationship between hydrogen concentrations during temperature decreasing in heat treatment and haze of wafers after the heat treatment.

Further, the inventors of the present invention performed similar measurement for haze of wafers. The results are shown in FIG. 3. From the results of FIG. 3, it can also be seen that the effect of improving haze of wafers is obtained if the amount of mixed hydrogen during the temperature decreasing is 1% by volume or more, like microroughness.

Figure 4:
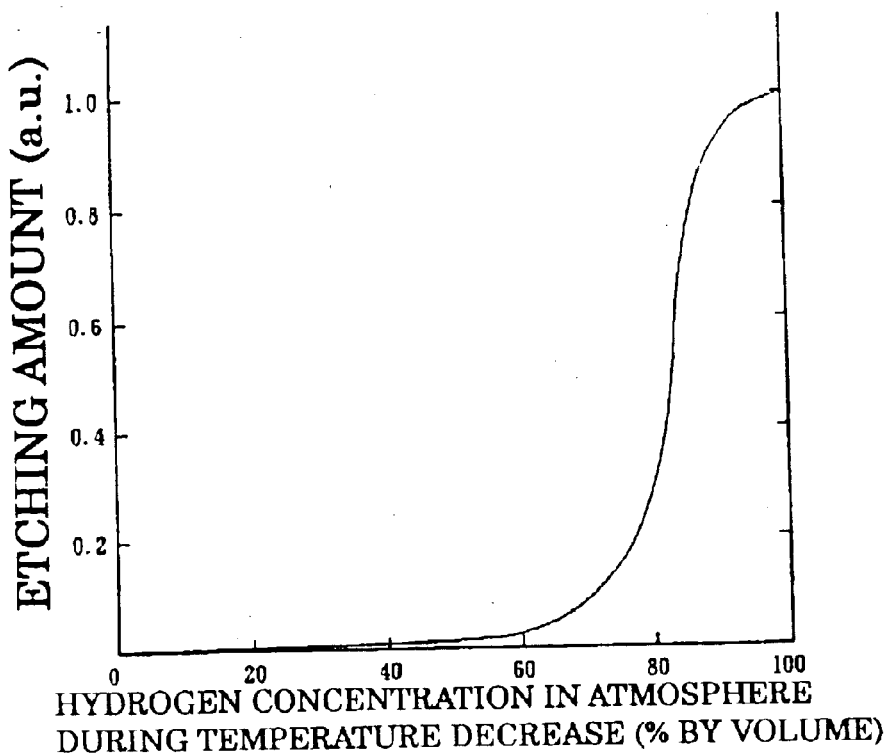
FIG. 4 is a graph representing the relationship between hydrogen concentrations during temperature decreasing in heat treatment and etched amounts of wafers after the heat treatment.

In addition, the inventors of the present invention performed measurement also about the relationship between the hydrogen concentration of the atmosphere during the temperature decreasing and the amount of etching of wafers. Evaluation of the amount of etching was performed by using SOI (Silicon On Insulator) wafers having a thickness of 1 $\mu$m, measuring SOI film thickness before and after the heat treatments, and calculating the difference of them. The results of the measurement are shown in FIG. 4. The ordinate of FIG. 4 represents arbitrary units, which are defined based on the amount of etching obtained with 100% of hydrogen concentration as a reference.

As shown in FIG. 4, when the hydrogen concentration of the atmosphere during the temperature decreasing was 30% by volume or less, etching of wafer surfaces hardly occured. However, it was found that, if the hydrogen concentration exceeded 30% by volume, etching began to be generated, and when it exceeded 60% by volume, the amount of etching of wafers increased sharply.

The above results are summarized as follows. That is, the surface conditions of the wafers after the heat treatment can be improved by introducing hydrogen into the atmosphere during the temperature decreasing of the heat treatment, and the sufficient effects of improving microroughness and haze of wafers can be obtained by a hydrogen concentration of 1% by volume or more. Further, it was found that the amount of etching within an acceptable range could be obtained by using a hydrogen concentration of 60% by volume or less.

Further, the inventors of the present invention performed examination also about the atmospheric composition during the retention of the heat treatment temperature in the heat treatment. Since it was found that surface roughness of wafers could be improved by introducing a suitable amount of hydrogen into the atmosphere during the temperature decreasing as described above, no problem will be caused even if argon is used as the heat treatment atmosphere during the retention of constant temperature. The inventors of the present invention performed experiments and examination about relationship between the amount of etching of wafers and the atmospheric composition during the retention of heat treatment temperature.

Heat treatment experiments were performed, in which a plurality of SOI wafers having an SOI film thickness of 1 $\mu$m were prepared, inserted into a heat treatment furnace, heated to 1200° C. at a temperature increasing rate of 10° C./min, maintained at 1200° C. for 60 minutes, and then cooled at a temperature decreasing rate of 3° C./min. The heat treatments were performed by varying the amount of hydrogen mixed into the argon atmosphere for each wafer during the retention of the constant temperature, and the etched amounts of SOI wafers after the heat treatments were measured. The temperature increasing and decreasing were performed in an argon atmosphere. The results of the measurement are shown in FIG. 5.

Figure 5:
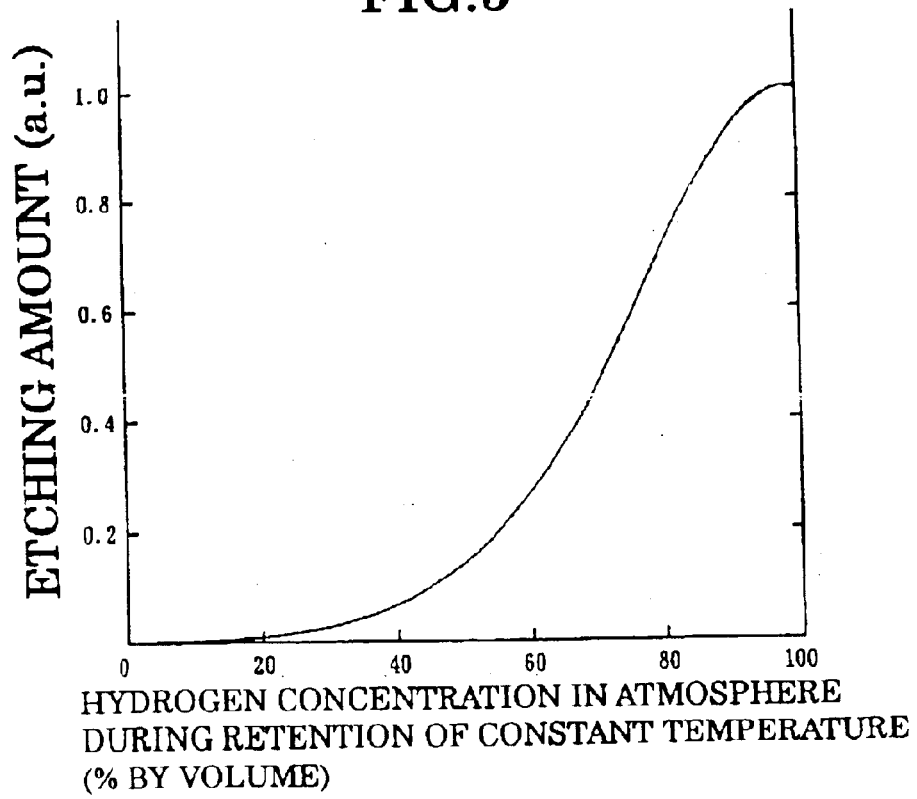
FIG. 5 is a graph representing the relationship between compositions of atmosphere during retention at a constant temperature and etched amounts of wafers after the heat treatment.

From the results of FIG. 5, it can be seen that, if the hydrogen concentration in the heat treatment atmosphere during the retention of the constant temperature is 30% by volume or less, etching of surfaces of wafers hardly occurs even after the heat treatment is performed at 1200° C. for 60 minutes. Therefore, surface roughness of wafers can also be improved during the retention of constant temperature by introducing 30% by volume or less of hydrogen into the atmosphere during this retention of constant temperature without generating etching. On the other hand, it was found that, if the amount of introduced hydrogen exceeded 30% by volume, the amount of etching of wafer surfaces became large and thus it was preferred that it should not exceed that value.

Furthermore, inventors of the present invention studied through various experiments about heat treatment conditions that could reduce the density of COPs present on silicon wafer surfaces to improve oxide dielectric breakdown voltage as well as can decrease haze to improve carrier mobility in a simpler manner compared with conventional methods in a heat treatment method using a rapid heating and rapid cooling apparatus. As a result, the inventors of the present invention found that COP density and haze can be simultaneously reduced or decreased by using a relatively low temperature decreasing rate of 20° C./sec or less for temperature decrease from the maximum temperature to 700° C. in the heat treatment.

It was conventionally thought that the effect of modifying wafer surfaces by heat treatment under a reducing atmosphere containing hydrogen should be determined mainly by the maximum temperature in the heat treatment and retention time at the temperature irrespective of use or disuse of an RTA apparatus, and the temperature increasing rate to the maximum temperature and the temperature decreasing rate from the maximum temperature were not taken so much into consideration.

In particular, when an RTA apparatus is used, the influence of temperature increasing and decreasing rates on wafer surfaces were not considered at all, since the times required for temperature increase and decrease are extremely shorter compared with usual heat treatment furnaces of resistance heating type, and temperature increasing and decreasing rates of 30–60° C./sec were usually used.

Therefore, the inventors of the present invention performed experiments of heat treatment of silicon wafers using the heat treatment method disclosed in Japanese Patent Application No. 10-82606. As a result, it was found that, even in a heat treatment using an RTA apparatus, surface conditions of wafers after the heat treatments differed, in particular, the haze level greatly differed, if the temperature decreasing rate from the maximum temperature differed.

The inventors of the present invention performed the following experiments in order to determine suitable temperature decreasing conditions in heat treatment of silicon wafers using an RTA apparatus.

Silicon wafers obtained by the Czochralski method were subjected to heat treatments at 1200° C. for 10 seconds under 100% hydrogen atmosphere by using an RTA apparatus while varying the temperature decreasing rate during temperature decreasing from the maximum temperature of the heat treatments, and haze of wafer surfaces was measured.

For the heat treatments, an RTA apparatus (rapid heating and rapid cooling apparatus Model SHS-2800, Steag Microtec International) was used.

The silicon wafers used were those obtained by slicing a silicon ingot manufactured by the Czochralski method and subjecting the sliced wafers to mirror polishing in a conventional manner, and having a diameter of 6 inches and crystal orientation of <100>.

Haze was measured by using a particle counter, LS-6030 (tradename of Hitachi Electronics Engineering Co., Ltd.) in a measurement voltage 700V range.

Figure 6:
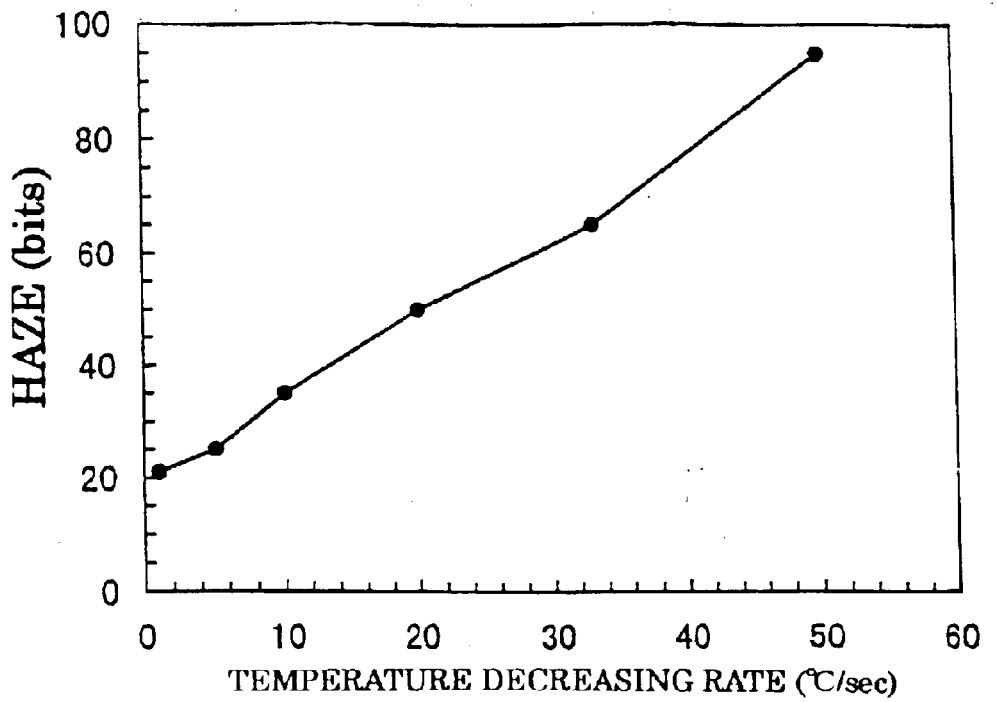
FIG. 6 is a graph representing the relationship between temperature decreasing rates and haze in heat treatment by an RTA apparatus.

The results of the measurement are shown in FIG. 6. FIG. 6 is a graph representing the relationship between temperature decreasing rate and haze. The ordinate of the graph in FIG. 6 represents the haze level in a unit of bit.

From the results of FIG. 6, it can be seen that as the temperature decreasing rate becomes slower, the haze level is more reduced. For example, when the temperature decreasing rate was 20° C./sec, the haze level was 50 bits or less, which is a satisfactory level in terms of the device characteristics. Moreover, it can be seen that, when temperature decreasing rate is 5° C./sec, it becomes extremely low level, i.e., 25 bits.

In addition, the inventors of the present invention precisely investigated the relationship between the temperature decreasing rate in the heat treatment and temperature region for the temperature decrease. In heat treatment experiments similar to those mentioned above, temperature decrease was performed at a temperature decreasing rate of 5° C./sec from the maximum temperature of 1200° C., and the temperature decreasing rate was accelerated to 60° C./sec when the temperature reached to a predetermined temperature during the temperature decrease. Then, haze of wafer surfaces was measured after the heat treatment in the same manner as described above. The results of the measurement are shown in FIG. 7.

Figure 7:
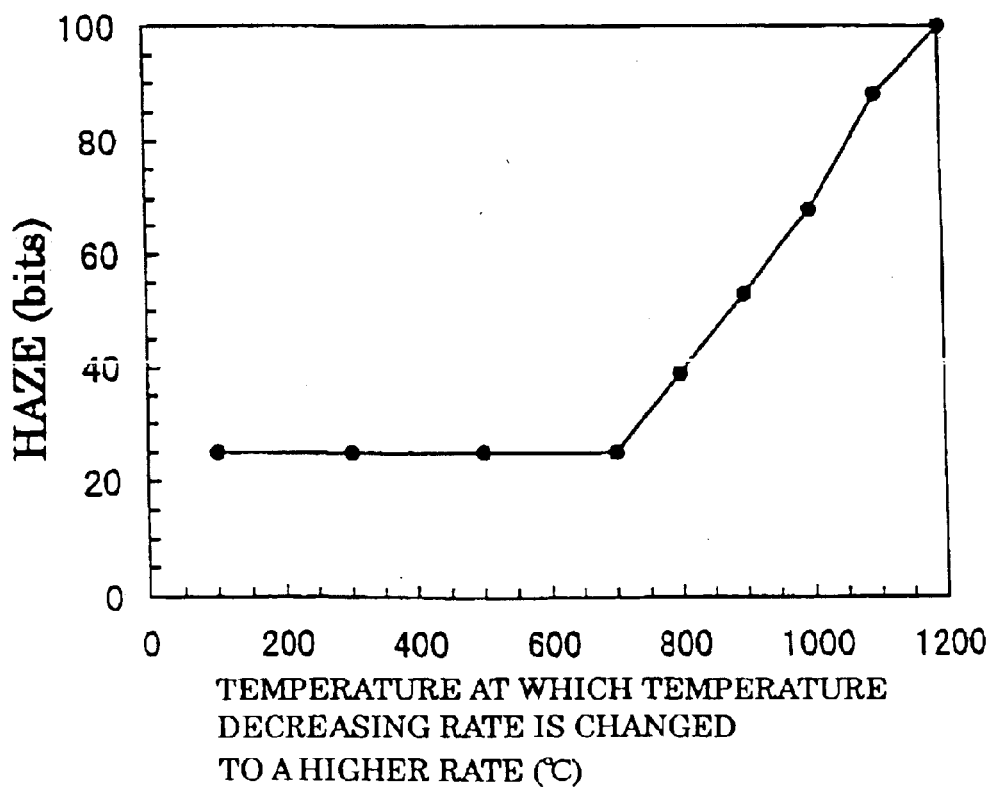
FIG. 7 is a graph representing the relationship between temperatures at which, temperature decreasing rate is changed to a higher rate and haze on wafer surfaces.

FIG. 7 is a graph representing the relationship between the temperature at which the temperature decreasing rate was changed to a higher rate and haze of the wafer surfaces. As shown in FIG. 7, when the temperature decreasing rate was changed to a higher rate in the temperature range of 1200° C. to around 750° C., the haze level of the wafer surfaces was degraded compared with the case where the low temperature decreasing rate was maintained. However, it can be seen that, when the temperature decreasing rate was changed to a higher rate after the temperature was decreased to a temperature region below 700° C., haze of wafer surfaces was not affected at all even when the temperature decreasing rate was accelerated thereafter.

That is, haze of wafer surfaces can sufficiently be improved by using a temperature decreasing rate of 20° C./sec or less in the region of from the maximum temperature in the heat treatment to 700° C., and it is not affected by the temperature decreasing rate in the temperature region below 700° C.

Although detail of the cause of such a phenomenon is unknown, it is thought that it is caused by such a mechanism as described below.

That is, if the heat treatment under a reducing atmosphere containing hydrogen is performed at a high temperature of, for example, 1200° C. or higher, it becomes likely that a step-like shape is formed on the surface.

These steps correspond to plane orientations that are different from the initial plane orientations of wafers and generated at the atomic level. The shape of such steps formed at the maximum temperature are maintained, if the temperature decreasing rate is fast. However, as the temperature decreasing rate becomes slower, surface energy is more stabilized due to the effect of migration, and thus the shape is flattened. As a result, it is thought that difference of the haze level is generated after the heat treatment depending on the temperature decreasing rate.

Therefore, it is considered that, if the temperature is slowly decreased from the maximum temperature of the heat treatment to about 700° C., migration is not caused at all in the temperature region blow that level, and hence the haze level of wafers is not affected even by rapid cooling at an accelerated temperature decreasing rate.

Based on the studies explained above, it was found that COP and haze of wafer surfaces can be improved in a method for heat treatment of silicon wafers under a reducing atmosphere containing hydrogen using a rapid heating and rapid cooling apparatus, by the simple method, i.e., by using a temperature decreasing rate of 20° C./sec or less for the temperature range of from the maximum temperature in the heat treatment to 700° C. In this method of the present invention, conditions of the high temperature heat treatment themselves are not changed like the aforementioned multi-step heat treatment of Japanese Patent Application No. 10-176693, and only the temperature decreasing rate, i.e., cooling intensity, is changed. Therefore, it is an extremely simple heat treatment method.

Further, since the heat treatment method of the present invention uses a relatively slow temperature decreasing rate, there is arisen anxiety for reduction of heat treatment efficiency. However, if temperature decrease from the maximum temperature of 1200° C. is considered, while it takes about 20 to about 40 seconds to decrease the temperature to room temperature with a usual temperature decreasing rate of 30–60° C./sec, it takes only about 60 seconds or less when the temperature decrease is attained at a rate of 20° C./sec and 4 minutes or less even when the temperature decrease is attained at a rate of 5° C./sec. Comparing with the usual heat treatment methods not using an RTA apparatus (for example, resistance heating method), which require 7–8 hours for heat treatment of 1 cycle, the treatment time for each wafer can be shortened by the heat treatment according to the method of the present invention, while it depends on the number of wafers to be treated.

Further, if it is desired to shorten the heat treatment time, there can be used a temperature decreasing rate for the region below 700° C. in the heat treatment faster than the temperature decreasing rate for the region from the maximum temperature to 700° C. For example, a wafer surface of a haze level comparable to that obtained by temperature decrease performed with a temperature decreasing rate of 5° C./sec for the whole temperature range can be obtained by performing the temperature decrease at a temperature decreasing rate of 5° C./sec from the maximum temperature of 1200° C. to 700° C., and then at a rate of 60° C./sec in the region below 700° C., although such temperature decrease takes only 2 minutes or less. Moreover, it is also possible to perform the temperature decrease at a rate of 70° C./sec or more by turning off a power source of lamps when the temperature reaches 700° C.

As for the atmosphere for the heat treatment using the rapid heating and rapid cooling apparatus, 100% of hydrogen or a mixed gas atmosphere of hydrogen and argon and/or nitrogen can be used. By using a higher hydrogen concentration, higher effect of improving surface roughness of wafer surfaces such as COP and haze can be obtained. On the other hand, by increasing the concentration of argon or nitrogen, there can be attained an advantage of easy handling.

The present invention will be further explained with reference to the appended drawings hereafter. However, the present invention is not limited by this explanation.

Figure 8:
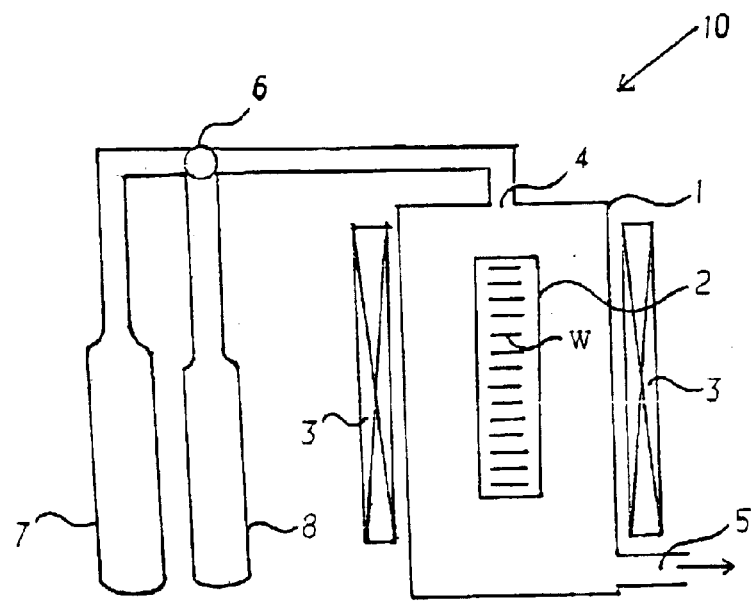
FIG. 8 is a schematic view of an exemplary heat treatment apparatus for performing the heat treatment according to the present invention.

FIG. 8 is a schematic view of an exemplary heat treatment apparatus for performing the heat treatment according to the present invention. As shown in FIG. 8, a heat treatment apparatus 10 has a chamber 1 in which the heat treatment is performed, and a support stand 2, on which wafers W to be subjected to the heat treatment are placed, is disposed in the chamber 1.

Heaters 3 are disposed outside the chamber 1, so that they surround the chamber 1. The chamber 1 has an gas intake 4, to which an argon feed source 7 and a hydrogen feed source 8 are connected through a mixer 6, so that an atmospheric gas consisting of each of the gases alone or a mixed gas of a desired mixing ratio can be introduced into the chamber 1. Further, the chamber 1 has an exhaust port 5, from which exhaustion is attained.

Now, a method for heat treatment of the wafer W using the aforementioned heat treatment apparatus 10 will be explained. The wafers W are first placed on the support stand 2, which is disposed in the chamber 1. Then, argon is fed into the chamber 1 through the gas intake 4 from the argon feed source 7. In this case, the atmosphere may be a mixed gas atmosphere that contains hydrogen introduced from the hydrogen feed source 8 through the mixer 6. As mentioned above, the mixing ratio of hydrogen is preferably 30% by volume or less in order to prevent etching of wafers.

After the air in the chamber 1 is fully substituted with the predetermined atmospheric gas, electric power supplied to the heaters 3 is increased to heat the chamber 1 to a desired temperature, and this temperature is maintained for a predetermined period. The term "to maintain a temperature" used herein just means to maintain a temperature within the temperature region for the heat treatment, and it may be increased or decreased during the heat treatment as required.

When the heat treatment of the wafers W is finished, the hydrogen concentration of the atmosphere is increased as required in order to reduce microroughness of the surface of the wafers W. In this operation, the mixing ratio of hydrogen fed from the hydrogen feed source 8 is increased by the mixer 6 to control the hydrogen concentration in the atmosphere to be 1–60% by volume. While a mixed gas of the desired hydrogen concentration is supplied from the gas intake 4, the electric power supplied to the heaters 3 is stopped or reduced to decrease the temperature at a predetermined temperature decreasing rate. When the temperature is decreased to a predetermined temperature, the wafers W and the support stand 2 are taken out from the chamber 1.

By performing heat treatment of silicon wafers as described above, there can be obtained a silicon wafer with a thick defect-free wafer surface layer and improved microroughness and haze of the wafer surface. Furthermore, since the temperature decreasing of the heat treatment according to the method of this present invention may be performed by using only a very small amount of hydrogen, the safety of the heat treatment process can also be secured.

Another embodiment of the present invention using an RTA apparatus will be explained.

Examples of the rapid heating and rapid cooling apparatus for silicon wafers used for the present invention include apparatuses such as lamp heaters for heat radiation. As an example of commercially available apparatuses, for example, Model SHS-2800, Steag Microtec International, can be mentioned. These apparatuses are not particularly complicated, and are not expensive either.

Figure 9:
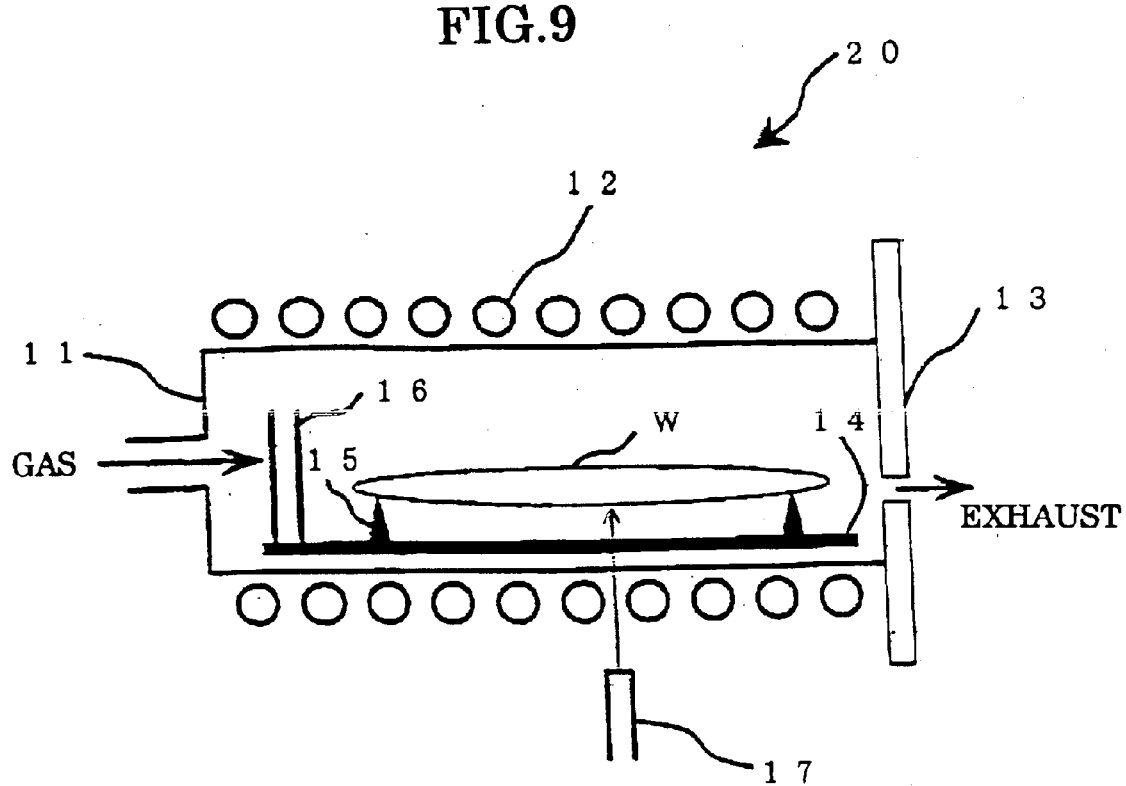
FIG. 9 is a schematic cross-sectional view of an exemplary apparatus that can rapidly heat and rapidly cool silicon wafers.

Now, an example of the rapid heating and rapid cooling apparatus (RTA apparatus) for silicon single crystal wafers used in the present invention will be explained. FIG. 9 is a schematic view of the RTA apparatus.

The heat treatment apparatus 20 shown in FIG. 9 has a chamber 11 consisting of quartz, and a wafer is heat treated within this chamber 11. Heating is achieved by heat lamps 12, which are disposed under and over the chamber and at left and right of the chamber so that they should surround the chamber 11. Electric power supplied to these lamps 12 can be independently controlled.

As for the gas supplying side, a non-illustrated hydrogen gas feed source, argon feed source and nitrogen gas feed source are connected, so that these gases can be mixed in an arbitrary ratio and supplied into the chamber 11.

An auto shutter 13 is provided at the gas exhausting side, and it shuts the inside of the chamber 11 off from the outer air. The auto shutter 13 has a wafer insertion port not shown in the figure which can be opened and closed by a gate valve. The auto shutter 13 is also provided with a gas exhausting outlet, so that the atmospheric pressure in the furnace can be controlled.

The wafer W is placed on a three-point supporting part 15 formed on a quartz tray 14. A buffer 16 made of quartz is provided at the gas inlet side of the tray 14, so that it can prevent the wafer W from being directly blown by the introduced gas flow.

Further, the chamber 11 is provided with a special window for temperature measurement, which is not shown in the figure, and the temperature of the wafer W can be measured by a pyrometer 17 installed in the outside of the chamber 11 through the special window.

By using the heat treatment apparatus 20 mentioned above, the heat treatment for rapid heating and rapid cooling of silicon wafers is performed as follows.

First, the wafer W is inserted into the chamber 11 from the insertion port and placed on the tray 14 by a wafer handling apparatus not shown in the figure. Then, the auto shutter 13 is closed. The inside of the chamber 11 is filled with a reducing atmosphere containing hydrogen at a predetermined ratio.

Subsequently, electric power is supplied to the heat lamps 12 to heat the wafer W to a predetermined temperature, for example, 1100° C. to the melting point of silicon, in particular, a temperature below 1300° C. In this operation, it takes, for example, about 20 seconds to attain the desired temperature. Then, the wafer W is maintained at the temperature for a predetermined period of time, and thus the wafer W can be subjected to a high temperature heat treatment.

When the predetermined time has passed and the high temperature heat treatment was finished, output of the lamps 12 is reduced to lower the temperature of the wafer W. The method for heat treatment of the present invention is a method characterized in that it uses a temperature decreasing rate of 20° C./sec or less for the region of from the maximum temperature to 700° C. When this method is performed, it is sufficient only to lower the temperature decreasing rate to 20° C./sec or less, while measuring the temperature of the wafer W by a pyrometer 17. This temperature decrease is conventionally performed at a temperature decreasing rate of 30–60° C./sec, taking about 20 to about 40 seconds. Therefore, the method of the present invention can be performed without substantially modifying conventionally used RTA apparatuses.

Finally, after the temperature decrease of the wafer is finished, the wafer is taken out by the wafer handling apparatus to finish the heat treatment.

If it is desired to shorten the heat treatment time, for example, the output of the lamps 12 can be turned off to rapidly cool the wafer W, after the temperature of the wafer measured by the pyrometer 17 is below 700° C. Alternatively, by taking out the wafer and transferring it to a space at room temperature by the wafer handling apparatus, the temperature decreasing rate in the region below 700° C. can also be accelerated and hence the heat treatment time can be shortened.

The present invention will be specifically explained hereafter with reference to the following examples of the present invention and comparative examples. However, the present invention is not limited by these.

EXAMPLE 1, COMPARATIVE EXAMPLES 1–5

A plurality of silicon wafers of the same specification were prepared and heat treatments thereof were performed, in which each wafer was inserted into a heat treatment furnace, heated to 1200° C. at a temperature increasing rate of 10° C./min, maintained at 1200° C. for 60 minutes, and then cooled at a temperature decreasing rate of 3° C./min. During the temperature increasing, retention of constant temperature and temperature decreasing, the atmospheric conditions were changed for each wafer to perform the heat treatments. Effect of the heat treatment was evaluated by measuring P-V value, haze, COP (Crystal Originated Particle) density of wafer surface and COP density of wafer surface layer of a depth of 0.5 $\mu$m from the wafer surface for each wafer after the heat treatments.

The silicon wafers used were those obtained by slicing a silicon ingot manufactured by the Czochralski method and subjecting the sliced wafers to mirror polishing in a usual manner, and having a diameter of 8 inches and crystal orientation of <100>.

The P-V value was measured by an AFM (Atomic Force Microscope, NanoScope-II, tradename of Digital Instrument Inc.) for a 2 $\mu$m square measurement area. Haze (ppm) was measured by using SP-1 produced by KLA/Tencor Co., Ltd.

The measurement of COPs on a wafer surface was performed by counting number of COPs for COPs present on the wafer surface and having a size of 0.1 $\mu$m or more using a particle counter, LS-6030 (tradename of Hitachi Electronics Engineering Co., Ltd.) in a 700V range.

The measurement of COP density within the depth of 0.5 $\mu$m from the wafer surface was performed by allowing growth of a thermal oxide film having a thickness of about 1 $\mu$m on the wafer surface and counting COPs through the oxide film by the aforementioned particle counter. That is, since increase of the measured value obtained after the oxidation compared with that obtained before the oxidation corresponds to the total of COPs contained in the layer of a depth of about 0.5 $\mu$m from the original silicon surface, the COP density can be obtained as described above.

The results of the measurement obtained as described above are shown in Table 1.

TABLE 1

| | Atmospheric condition during temperature increase and constant temperature | Atmospheric condition during temperature decrease | Haze (ppm) | P-V value (nm) | COP density ($\geq$0.1 $\mu$m) Surface (COP/cm$^2$) | Depth of 0.5 $\mu$m (COP/cm$^3$) |
|---|---|---|---|---|---|---|
| Example 1 | 100% Argon | 1% Hydrogen 99% Argon | 0.40 | 0.73 | 0.15 | 1.5 × 10$^3$ |
| Comparative Example 1 | No heat treatment | No heat treatment | 0.30 | 0.80 | 2.20 | 1.5 × 10$^4$ |
| Comparative Example 2 | 100% Hydrogen | 100% Hydrogen | 0.31 | 0.76 | 0.14 | 2.0 × 10$^3$ |
| Comparative Example 3 | 100% Argon | 100% Argon | 1.42 | 1.33 | 0.15 | 1.5 × 10$^3$ |
| Comparative Example 4 | 100% Argon | 100% Hydrogen | 0.35 | 0.71 | 0.15 | 2.0 × 10$^3$ |
| Comparative Example 5 | 100% Argon | 80% Hydrogen 20% Argon | 0.37 | 0.72 | 0.15 | 1.9 × 10$^3$ |

From the results of Table 1, it can be seen that the silicon wafer subjected to the heat treatment according to the method for heat treatment of the present invention (Example 1) has a P-V value and haze comparable to those of the wafer subjected to heat treatment using only the hydrogen atmosphere (Comparative Example 2), and its wafer surface shows little microroughness and hence superior flatness.

Moreover, this wafer has a good surface COP density comparable to that of the wafer subjected to heat treatment only with the argon atmosphere (Comparative Example 3), and it also shows a COP density for a depth of 0.5 μm comparable to that obtained with only the argon atmosphere. That is, it is presumed that this wafer had a thick defect-free layer, although it was subjected to the heat treatment using the atmosphere containing hydrogen as the atmosphere during the temperature decreasing, and etching of the silicon wafer surface did not substantially occur.

From the results mentioned above, it can be seen that the wafer subjected to the heat treatment of the present invention is a silicon wafer of higher quality of which crystal defects on the surface and in the surface layer are eliminated without degrading microroughness on the wafer surface etc., compared with the wafer before the heat treatment (Comparative Example 1).

On the other hand, while the wafer obtained with temperature increase and retention of constant temperature in the argon atmosphere and temperature decrease in 100% by volume of hydrogen (Comparative Example 4) and the wafer obtained with temperature decrease in 80% by volume of hydrogen and 20% by volume of argon (Comparative Example 5) showed good P-V values and haze, their COP densities at a depth of 0.5 μm from the wafer surfaces were degraded compared with the wafer of the present invention.

This is considered to be caused because the hydrogen concentration in the atmosphere during the temperature decreasing was high, and thus etching of wafer surfaces were generated to reduce the thickness of defect-free layers of the wafer surface layers to 0.5 μm or less.

EXAMPLE 2

A silicon wafer obtained by the Czochralski method was subjected to a heat treatment using an RTA apparatus at 1200° C. for 10 seconds under 100% hydrogen atmosphere. The temperature decreasing rate during temperature decreasing from the maximum temperature of the heat treatment was 20° C./sec according to the method of present invention. Haze on the surface of the silicon wafer was measured after the heat treatment.

For the heat treatment, the aforementioned RTA apparatus (rapid heating and rapid cooling apparatus Model SHS-2800, Steag Microtec International) was used.

The silicon wafer used was one obtained by slicing a silicon ingot manufactured by the Czochralski method and subjecting the sliced wafer to mirror polishing in a usual manner, and having a diameter of 6 inches and crystal orientation of <100>.

Haze was measured by using a particle counter, LS-6030 (tradename of Hitachi Electronics Engineering Co., Ltd.) in a measurement voltage 700V range. The haze level was represented in a unit of bit.

As a result of the measurement, the wafer of Example 2 was found to have a haze level of about 49 bits, which was markedly improved compared with one obtained with high-speed cooling, and was a level causing no problem in the device production. Further, the heat treatment time was prolonged by only 40 seconds or less compared with the case where temperature decreasing was performed at the rate of 60° C./sec in a conventional method. This does not greatly affect the productivity, and the productivity can be improved compared with the case using the resistance heating technique.

EXAMPLE 3

A silicon wafer was subjected to a heat treatment in the same manner as Example 2, except that a temperature decreasing rate of 5° C./sec for the region of from the maximum temperature of 1200° C. to 700° C. and a temperature decreasing rate of 60° C./sec for the region below 700° C. were used. The heat treatment and the haze measurement were performed in the same manner as Example 2 except for the aforementioned modifications.

As a result of the measurement, the wafer of Example 3 was found to have a haze level of about 25 bits, which is markedly improved and well meets to higher integration degree in future.

COMPARATIVE EXAMPLE 6

A silicon wafer was subjected to a heat treatment in the same manner as Example 2, except that a temperature decreasing rate of 50° C./sec was used for the region of from the maximum temperature of 1200° C. The heat treatment and the haze measurement were performed in the same manner as Example 2 except for the aforementioned modification.

As a result of the measurement, the wafer of this comparative example was found to have a large haze level of 95 bits, which is expected to degrade the electric characteristics of wafers such as oxide dielectric breakdown voltage and carrier mobility.

The present invention is not limited to the embodiments described above. The above-described embodiments are mere examples, and those having the substantially same structure as that described in the appended claims and providing the similar functions and advantages are included in the scope of the present invention.

For example, while the aforementioned embodiments are mainly explained for the cases where the heat treatment was performed for silicon wafers containing many crystal defects such as COPs before they were subjected to the heat treatment, the method for heat treatment of the present invention can be used for silicon wafers with few crystal defects with a purpose of improving microroughness on the wafer surfaces.

Further, the aforementioned embodiment using an RTA apparatus was explained mainly for the effect of improving haze on wafer surfaces and simultaneously reducing COPs of wafers. However, the effects of the method for heat treatment of the present invention are not limited to the improvement of haze, but it can also improve surface conditions represented by the P-V values of wafer surfaces (maximum difference between peaks and valleys) or other parameters, and improve flatness of wafer surfaces.

Further, while the embodiments mentioned above were explained for the heat treatment of silicon wafers having a diameter of 6 inches or 8 inches, the present invention can of course be used regardless of the wafer diameter, and can satisfactorily be used for a silicon wafer having a diameter of, for example, 12 to 16 inches or more, which are expected to be used in future.

What is claim is:

1. A method for heat treatment of silicon wafers, comprising:

subjecting a silicon wafer to heat treatment at a temperature of from 1000° C. to the melting point of silicon in an argon atmosphere;

increasing a mixing ratio of hydrogen in the atmosphere to control a hydrogen concentration to be 1–60% by volume; and decreasing the heat treatment temperature in the atmosphere.

* * * * *